United States Patent
Nguyen et al.

(10) Patent No.: US 6,281,132 B1
(45) Date of Patent: Aug. 28, 2001

(54) DEVICE AND METHOD FOR ETCHING NITRIDE SPACERS FORMED UPON AN INTEGRATED CIRCUIT GATE CONDUCTOR

(75) Inventors: Thien T. Nguyen, Austin; Mark I. Gardner, Cedar Creek; Charles E. May, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/167,622

(22) Filed: Oct. 6, 1998

(51) Int. Cl.[7] .................. H01L 21/3065; H01L 21/461

(52) U.S. Cl. .................. 438/706; 438/710; 438/714; 438/723; 438/724

(58) Field of Search .................. 438/706, 710, 438/714, 723, 724

(56) References Cited

U.S. PATENT DOCUMENTS

| | | | |
|---|---|---|---|
| 4,253,907 | * 3/1981 | Parry et al. | 427/41 |
| 4,326,911 | 4/1982 | Howard et al. | 438/718 |
| 4,348,577 | 9/1982 | Toyada et al. | 219/121.41 |
| 4,952,274 | 8/1990 | Abraham | 438/697 |
| 5,021,121 | 6/1991 | Groechel et al. | 438/712 |
| 5,169,487 | 12/1992 | Langley et al. | 438/714 |
| 5,171,401 | 12/1992 | Roselle | 438/720 |
| 5,219,793 | 6/1993 | Cooper et al. | 438/624 |
| 5,242,538 | 9/1993 | Hamrah et al. | 216/66 |
| 5,254,494 | 10/1993 | Van Der Plas et al. | 438/448 |
| 5,269,879 | * 12/1993 | Rhoades et al. | 156/643 |
| 5,316,980 | 5/1994 | Takeshiro | 438/697 |
| 5,317,193 | 5/1994 | Watanabe | 257/774 |
| 5,322,590 | 6/1994 | Koshimizu | 156/345 |
| 5,346,578 | 9/1994 | Benzing et al. | 156/345 |
| 5,398,712 | 3/1995 | Wang et al. | 137/15.06 |
| 5,399,527 | 3/1995 | Tabara | 438/625 |
| 5,401,998 | 3/1995 | Chiu et al. | 257/368 |
| 5,405,480 | 4/1995 | Benzing et al. | 156/345 |
| 5,445,709 | 8/1995 | Kojima et al. | 438/729 |
| 5,461,010 | 10/1995 | Chen et al. | 438/699 |
| 5,464,499 | * 11/1995 | Moslehi et al. | 216/71 |
| 5,472,829 | 12/1995 | Ogawa | 430/325 |
| 5,529,948 | 6/1996 | Lur et al. | 438/450 |
| 5,534,731 | 7/1996 | Cheung | 257/759 |

(List continued on next page.)

FOREIGN PATENT DOCUMENTS

| | | | |
|---|---|---|---|
| 0 596 593 | 5/1994 | (EP) | H01L/21/311 |
| 0 655 775 | 5/1995 | (EP) | H01L/21/311 |
| 2240923 | 9/1990 | (JP) | H01L/21/30 |
| 5129247 | 5/1993 | (JP) | H01L/21/302 |

OTHER PUBLICATIONS

Wolf, "Silicon Processing for the VLSI Era Process Integration," p. 198 (1990).

Tsai et al., "High selectivity plasma etching of silicon dioxide with a dual frequency 27/2 MHz capacitive radio frequency discharge," J. Vac. Sci. Technol. B, vol. 14, No. 5, Sep./Oct. 1996, pp. 3276–3282.

Primary Examiner—Benjamin L. Utech
Assistant Examiner—Lynette T. Umez-Eronini
(74) Attorney, Agent, or Firm—Kevin L. Daffer; Conley, Rose & Tayon P.C.

(57) ABSTRACT

A dry etch method is presented wherein a semiconductor substrate is introduced between a first electrode and a second electrode maintained within a reaction chamber. In this method, a main etch step is performed in which a first quantity of low frequency power is applied to the pair of electrodes from an RF power source. A first gas flow is circulated through the reaction chamber during the application of power. This first gas flow includes a first argon flow, a first oxygen flow, and a first fluorocarbon flow. Applying the first quantity of low frequency power creates a first plasma for etching a portion of a nitride layer arranged above the semiconductor substrate.

25 Claims, 3 Drawing Sheets

U.S. PATENT DOCUMENTS

| | | | |
|---|---|---|---|
| 5,549,786 | 8/1996 | Jones et al. | 438/723 |
| 5,571,751 | 11/1996 | Chung | 438/625 |
| 5,621,241 | 4/1997 | Jain | 257/632 |
| 5,632,855 | 5/1997 | Jones et al. | 438/714 |
| 5,641,546 | 6/1997 | Elwell et al. | 427/575 |
| 5,654,570 * | 8/1997 | Agnello | 257/338 |
| 5,792,693 * | 8/1998 | Tseng | 438/254 |

* cited by examiner

DEVICE AND METHOD FOR ETCHING NITRIDE SPACERS FORMED UPON AN INTEGRATED CIRCUIT GATE CONDUCTOR

BACKGROUND OF THE INVENTION

1. Field of the Invention

This invention relates to semiconductor processing and, more particularly, to an improved dry etch method of use in the formation of nitride spacers.

2. Description of the Related Art

Fabrication of a metal oxide semiconductor field-effect transistor (MOSFET) device is well known. MOSFETs are generally manufactured by placing an undoped polycrystalline silicon ("polysilicon") material over a relatively thin layer of silicon dioxide ("oxide"). The polysilicon material and the oxide are then patterned to form a gate conductor arranged upon a gate oxide with source/drain regions adjacent to and on opposite sides of the gate conductor. The gate conductor and source/drain regions are then implanted with an impurity dopant species.

Operating transistors which have heavily doped source/drain regions arranged directly adjacent to the gate conductor often experience a problem known as hot carrier injection ("HCI"). HCI is a phenomena by which the kinetic energy of the charged carriers (holes or electrons) is increased as they are accelerated through large potential gradients, causing the charged carriers to become injected into and trapped within the gate oxide. The greatest potential gradient, often referred to as the maximum electric field ("Em"), occurs near the drain during saturated operation. Because of carrier entrapment within the gate oxide, a net negative charge density forms in the gate oxide. The trapped charge can accumulate with time, resulting in a positive threshold shift in a NMOS transistor or a negative threshold shift in a PMOS transistor.

To overcome problems of sub-threshold current and threshold shift resulting from HCI, an alternative drain structure known as the lightly doped drain ("LDD") is commonly used. The purpose of the LDD is to absorb some of the potential into the drain and thus reduce Em. A conventional LDD structure is one in which a light concentration of dopant is self-aligned to the gate conductor followed by a heavier concentration of dopant self-aligned to the gate conductor on which two sidewall spacers have been formed. The purpose of the first implant dose is to produce a lightly doped section within the active area (hereinafter "junction") at the gate edge near the channel. The second implant dose is used to form a heavily doped source/drain region within the junction laterally outside the LDD area. Because the second implant dose is spaced from the channel by the spacers, the lateral thickness of the spacers dictates the length of the LDD and source/drain regions.

The spacers are typically formed by first chemical vapor depositing ("CVD") an oxide layer over the gate conductor. The oxide layer is then patterned to form spacers on the sidewall of the gate conductor. While oxide spacers are commonly used in MOSFETs, these spacers do have drawbacks. For example, the boron used to form junctions in PMOSFET devices may migrate from the silicon substrate into oxide spacers. This boron up-diffusion can undesirably reduce the dopant density in the underlying junctions. In addition, metal deposited over oxide spacers during the process of salicide formation may react with silicon in the spacers to form a silicide that bridges across the separation between the source/drain regions and the gate conductor provided by the spacers. This phenomenon, referred to as "silicide shorting", can cause the gate to become shorted to the source/drain regions.

The aforementioned problems of oxide spacers can be mitigated by the use of spacers composed of silicon nitride ("nitride"). Nitride is a fairly stable material and is nearly impervious to diffusion, making it an excellent barrier material. Because of this property, dopants such as the boron in the junctions of PMOSFET devices are substantially prevented from up-diffusing into nitride spacers. Furthermore, the diffusion length of the silicon within nitride spacers is fairly short and therefore does not readily react with the metal deposited over the spacers during the salicidation process. As a result, the likelihood of silicide shorting occurring is greatly reduced.

Two methods commonly used to deposit nitride layers are low pressure chemical vapor deposition ("LPCVD") and plasma enhanced chemical vapor deposition ("PECVD"). LPCVD deposition of nitride commonly involves the formation of nitride from a reaction between dichlorosilane and ammonia at relatively low pressures, but at high temperatures (e.g., 700–800° C.). In PECVD deposition of nitride, silane is usually reacted with nitrogen and/or ammonia at relatively low temperatures (200–400° C.) in a plasma. In general, spacers formed from PECVD nitride layers are softer and less stoichiometric than spacers arising from LPCVD nitride layers.

Even with the potential problems of nitride spacers, oxide spacers are still used. Consequently, a fab must usually have processes in place capable of forming nitride and oxide spacers. The differences in etch chemistries of oxide and nitride, however, often necessitate a dedicated etch tool for each species. Unfortunately, wafers often contain layers of oxide and nitride that must be etched in succession. Having to transfer the wafer from one etch system to another adds time to the fabrication process and reduces throughput. Moreover, an undesirable risk of contamination is created when the wafer must be transferred between reaction chambers. It would be desirable, therefore, to create a process that would allow nitride and oxide layers to be etched by a single tool.

Regardless of the type of spacers to be formed, the layer from which the spacers are formed is preferably deposited conformally. As a result of this conformal deposition, the layer is often thicker at the edges of the gate-to-junction steps then on flat (horizontal) areas. An anisotropic etch process will thus clear the layer from the flat areas while leaving spacers on the sidewalls of the gate electrode. Because of the ability of dry etch processes to etch anisotropically (in comparison to wet etch processes, which etch isotropically), dry etching is typically used in spacer formation.

There are three types of dry etch processes: those that have a physical basis (e.g., ion beam milling), those that have a chemical basis (e.g., plasma etching), and those that combine both physical and chemical mechanisms (e.g., reactive ion etching). Primarily physical dry etch methods may not exhibit sufficient selectivity to both masking materials and the underlying substrate, while primarily chemical processes typically etch isotropically. Consequently, ion-assisted etching processes that combine the two mechanisms are often preferred in spacer fabrication.

Ion assisted etching can be carried out in a variety of types of commercial dry etch systems. One commonly used configuration is the parallel electrode reactor system. These systems typically have a diode configuration with two parallel, circular electrodes spaced by a gap. One of the electrodes is connected to a radio frequency ("RF") power supply, and the other is grounded. The wafer is placed on the to-be-powered electrode. A pump is used to adjust the pressure within the reaction chamber to the desired level, and etchant gases are introduced into the reaction chamber. By applying power to an electrode, a plasma may be created within the chamber. Because the wafer is placed on the powered electrode, energized ions from the plasma may bombard the wafer. The combination of physical and chemical processes allows for etching that is both anisotropic and selective. The degree of anisotropy and selectivity, as well as other factors such as the etch rate, are determined by a variety of parameters. These parameters include: the quantity and frequency of the power supplied, the gap between the electrodes, the type and flow rate of etchant gas into the reaction chamber, and the pressure within the reaction chamber.

The values of the above-listed parameters selected for a particular etching process can have a significant impact on the properties of the final integrated circuit. Therefore, these values must be carefully selected. Because of the effect that the length of the LDD and source/drain regions has on circuit attributes (e.g., drive current), it is important that the thickness of these regions be as close to the desired values as possible. Consequently, the dry etch processes used in the fabrication of sidewall spacers should result in the formation of spacers that have a high degree of thickness uniformity. That is, the thickness of sidewall spacers should vary as little as possible from desired values. Spacer thickness uniformity should occur both across each wafer and from wafer-to-wafer.

One measure of spacer thickness uniformity is the standard deviation of the thicknesses of a number of spacers. Standard deviation is a measure of the dispersion of a set of data from their mean, and may be calculated by taking the square root of the variance. By looking at the standard deviation of the thicknesses of a set of spacers formed by a particular etch process, the ability of that process to form uniformly thick spacers may be seen. Unfortunately, many conventional etch processes are only capable of forming nitride spacers whose thicknesses have a standard deviation of 10 percent or more. While nitride spacers may be formed from nitride layers deposited by LPCVD techniques, nitride spacers formed from PECVD layers are often preferred because of the lower deposition temperatures involved in that process. Because of the properties of PECVD nitride, however, it is even more difficult for most etch processes to achieve high spacer thickness uniformity from PECVD nitride layers. In some cases, this problem may even prevent the use of such layers in spacer formation processes.

As feature size decreases to 0.18 micron and below, the thickness of the spacers should decrease as well. Because reduced feature sizes exacerbate the effect of a specific amount of deviation from average, the variability in spacer thickness uniformity that may result from conventional dry etch processes becomes an even greater problem when ultra thin spacers must be formed. Therefore, it is desirable to develop a method that would allow the formation of nitride spacers, and particularly PECVD nitride spacers, with a higher degree of thickness uniformity than is possible with current etch techniques. The process should be able to maintain high thickness uniformity even when forming ultra thin nitride spacers.

SUMMARY OF THE INVENTION

The problems described above are in large part addressed by the improved dry etch method and product thereof presented herein. The method uses ion-assisted etching and preferably includes a main etch step and an overetch step. The main etch step may be used to etch nitride deposited by a variety of techniques and containing various amounts of impurities. The overetch step may be used to remove portions of an oxide layer disposed beneath the nitride layer and above a semiconductor substrate. Because the present process allows for the etching of nitride and oxide layers within a single reactor system, dedicated etch tools for each species may not be necessary.

The selected process parameters provide for an etch process that has a high degree of anisotropy but does not substantially damage the underlying substrate. As stated above, most conventional processes have difficulty forming nitride spacers that have a high degree of thickness uniformity, particularly when the nitride layer from which the spacers are formed is deposited by PECVD techniques. The present process, however, allows for the formation of nitride spacers that have a high degree of thickness uniformity within a wafer (<3 angstroms/standard deviation) from both LPCVD and PECVD deposited nitrides. Even when forming nitride spacers as thin as about 150–350 angstroms, a high degree of thickness uniformity of less than 3.0 angstroms is achievable. Moreover, the present process is able to accomplish these goals without relying entirely on low etch rate processes and suffering the sacrifice in throughput that comes with such processes. Although the process is of particular use in spacer fabrication, it should be understood that the main etch step of the process may be used alone or in conjunction with the overetch step in any of a variety of nitride etch situations.

As stated above, a plasma may be created by the application of power to at least one electrode maintained within a reaction chamber through which an etchant gas is circulated. An attribute often used to characterize plasmas is the ratio of fluorine species to carbon species within the plasma (i.e., the F:C ratio). The F:C ratio is an important indicator, among other things, of the selectivity to silicon over oxide of a plasma. Variations in this ratio may be used to increase or decrease the ratio between the silicon etch rate and the oxide etch rate. By controlling the relative speeds of these etch rates, the oxide:silicon selectivity of a etching process may be regulated.

Fluorocarbons (e.g., $CF_4$) are often used in the feed gas to the chamber for the etching of materials such as oxide, nitride, and silicon. The F:C ratio is in large part determined by the ratio of fluorine atoms to carbon atoms in the gas flow. For example, a plasma formed from a pure $CF_4$ feed has an F:C ratio of 4:1. The oxide:silicon selectivity of a plasma may be increased by the use of gases in which the F:C ratio is less than 4, such as $CHF_3$. The addition of hydrogen to the feed gas may also reduce the F:C ratio of a plasma. Conversely, the addition of oxygen to the feed gas may increase the F:C ratio of a plasma. The types and flow rates of etchant gases used in dry etch processes may be chosen to manipulate the F:C value of a plasma and to control the plasma etch rate and selectivity to certain species.

Broadly speaking, the present invention presents a dry etch method. In this method, a semiconductor substrate is first introduced between a pair of electrodes maintained within a reaction chamber. A main etch step is performed in which a first quantity of low frequency power is applied to the pair of electrodes from an RF power source. A first gas flow is circulated through the reaction chamber during the application of power. This first gas flow includes a first argon flow, a first oxygen flow, and a first fluorocarbon flow. Applying the first quantity of low frequency power creates a first plasma for etching a portion of a nitride layer arranged above the semiconductor substrate.

In an embodiment, the nitride layer is arranged above a gate conductor that is arranged above the semiconductor substrate. Etching of a portion of the nitride layer forms nitride spacers adjacent to the sidewalls of the gate conductor. The main etch step preferably makes up the majority of total etch time in the present process. Since increases in throughput are generally desirable, the main etch step is preferably configured to have a relatively high nitride etch rate (e.g., 25 angstroms per second). Unfortunately, the etch chemistries of nitride and silicon make it difficult to develop dry etch processes that have a high nitride:silicon selectivity. Consequently, if the nitride layer is deposited directly upon the semiconductor substrate a process with a high nitride etch rate could remove substantial amounts of the silicon substrate before all nitride is cleared from above any junctions formed within the semiconductor substrate.

In order to resolve this problem, another embodiment includes an oxide layer that may be disposed beneath the nitride layer and above the silicon substrate. The main etch step is preferably configured to have good selectivity to nitride over oxide. The presence of the oxide layer between the nitride layer and the semiconductor substrate may aid in allowing the portions of the nitride layer adjacent to the exposed lateral sidewalls of the nitride spacers and overlying junctions to be cleared out without removing substantial portions of the semiconductor substrate.

The high nitride:oxide selectivity of the main etch step is in large part accomplished by the proper selection of gases in the first gas flow and the flow rates of these gases relative to each other. The first fluorocarbon flow of the first gas flow may include trifluoromethane ($CHF_3$) and carbon tetrafluoride ($CF_4$) at a ratio of about 0.4–0.6:1, and optimally at a ratio of about 0.5:1. The combination of $CHF_3$ with $CF_4$ in the first fluorocarbon flow makes the ratio of fluorine atoms to carbon atoms in the first fluorocarbon flow less than 4:1. While such a gas mix will etch nitride slower than a pure $CF_4$ etchant gas, the selected ratio nevertheless allows for a relatively fast, highly uniform etch of the nitride layer. The ratio between the flow rate of the first oxygen flow and the flow rate of the first fluorocarbon flow may be about 0.17–0.26:1, and is optimally about 0.21:1. The addition of oxygen in the first gas flow increases the F:C ratio of the first plasma and thus increases the selectivity of the first plasma to oxide. Oxygen may also aid in the removal of non-volatile carbon residues that can form during the etching process. In addition, argon within the first gas flow may help increase the uniformity of the plasma by acting as a diluent. To this end, the flow rate of the first argon flow may be about 75–83 percent of the total flow rate of the first gas flow. Optimally, the flow rate of the first argon flow is about 79 percent of the total flow rate of the first gas flow.

The overetch step of the present process may constitute about 5% of the total etch time. The process parameters for this step are primarily selected to remove the portions of the oxide layer that are adjacent to the exposed lateral sidewalls of the nitride spacers and overlying junctions without removing substantial portions of the semiconductor substrate. Consequently, the ratio of $CHF_3$ to $CF_4$ in the second fluorocarbon flow of the second gas flow is preferably higher than the respective ratio in the first fluorocarbon flow. Increasing the ratio of $CHF_3$ to $CF_4$ in the second gas flow further decreases the F:C ratio of the second plasma, thus increasing the selectivity to oxide over silicon of the overetch step. The ratio of $CHF_3$ to $CF_4$ in the second gas flow may be about 1.9–2.9:1, and is optimally about 2.3:1. Argon may also be used to dilute the second gas flow. Therefore, the second argon flow is optimally about 85–86 percent of the total flow rate of the second gas flow. The oxide:silicon selectivity of the overetch step is preferably about 15:1.

A semiconductor substrate is also presented. A plurality of gate conductors may be arranged above the semiconductor substrate. A plurality of spacers is arranged adjacent to the sidewalls of each of the plurality of gate conductors. The plurality of spacers is preferably composed of nitride and may be formed by the process described herein. An average thickness of the plurality of spacers can range between 150 and 350 angstroms. In this thickness range, the standard deviation of the thicknesses of the plurality of spacers is less than approximately 3.0 angstroms. In addition, a plurality of oxide buffers may be disposed between each of the plurality of spacers and the sidewalls of each of the plurality of gate conductors.

BRIEF DESCRIPTION OF THE DRAWINGS

Other objects and advantages of the invention will become apparent upon reading the following detailed description and upon reference to the accompanying drawings in which.

Figure 1:
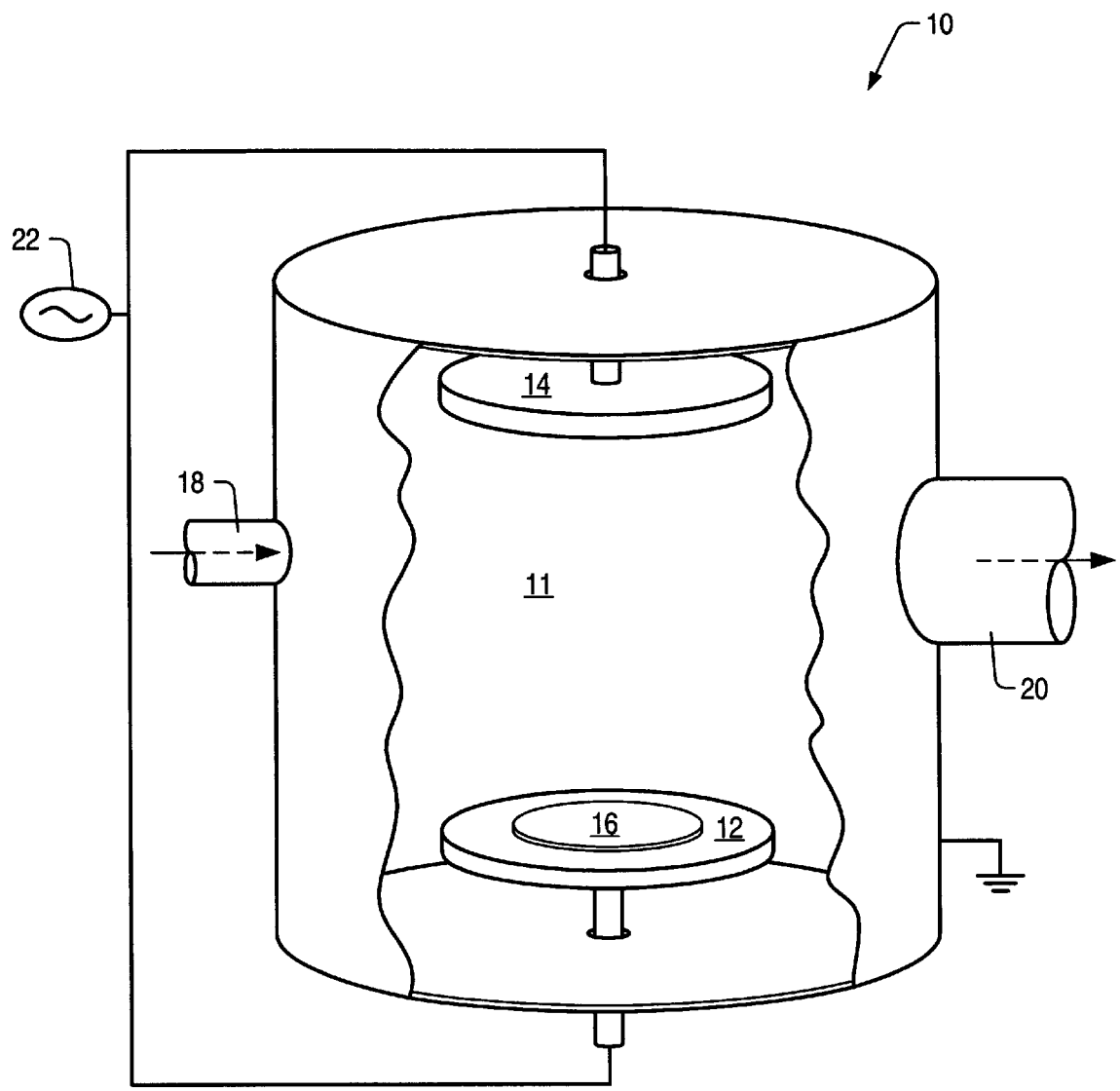
FIG. 1 is an isometric view in partial breakaway of a parallel electrode reactor configured to be used in ion-assisted etching processes.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to FIG. 1, a parallel electrode reactor system 10 is shown that is configured to be used in ion-assisted etching processes. Reactor system 10 may be any of the variety of commercially available reactors that are capable of carrying out the present invention. A suitable system is the Lam model 4500, which may be obtained from Lam Research Corporation, Freemont, Calif. Reactor 10 includes a first electrode 12 and a second electrode 14 within a reaction chamber 11. RF power source 22 is preferably connected to first electrode 12 and second electrode 14. The walls of reaction chamber 10 may be grounded.

In dry etch reactors, high frequency RF power sources are commonly used that supply power at 13.56 MHz. This is an ISM (Industry, Scientific, Medical) standard frequency, and thus is subject to less stringent government mandated radiation limits. Power source 22, however, is preferably a low frequency (i.e., <5 MHz) RF source. Because ion bombardment effects are enhanced at lower frequencies, the use of low frequency power preferably provides for a higher degree of anisotropy in etching. The frequency of power supplied by power source 22 is more preferably about 360–440 kHz, and is optimally about 400 kHz.

Figure 2:
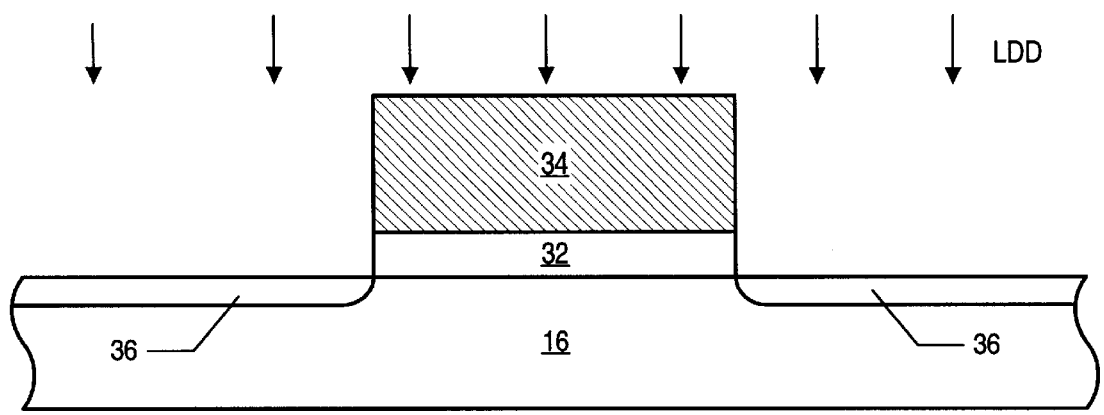
FIG. 2 is a partial cross-sectional view of a semiconductor topography, wherein a LDD implant that is self-aligned to the sidewalls of a gate conductor is forwarded to the semiconductor topography.

FIGS. 2, 3, 4, 5, 6, and 7 present a process flow in which sidewall spacers may be used to help define LDD and source/drain regions within a semiconductor substrate. Reactor system 10 may be utilized in the fabrication of the spacers. FIG. 2 depicts a semiconductor substrate 16, which is preferably a wafer of single crystal silicon. Gate conductor 34 and gate oxide 32 are preferably arranged upon the surface of semiconductor substrate 16. An LDD implant may be carried out to form LDD regions 36 that are substantially aligned to the sidewalls of gate conductor 34.

Figure 3:
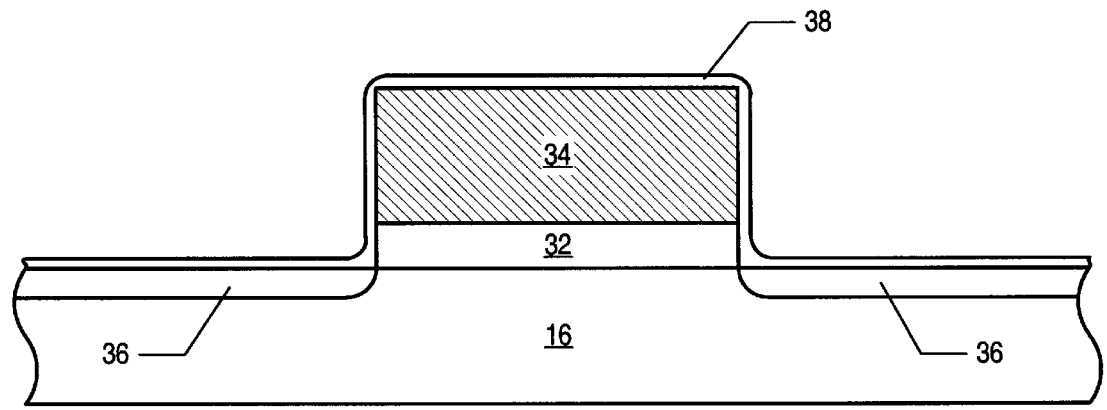
FIG. 3 is a partial cross-sectional view of a semiconductor topography, wherein a conformal oxide layer is formed over the gate conductor according to a processing step subsequent to FIG. 2.
Figure 4:
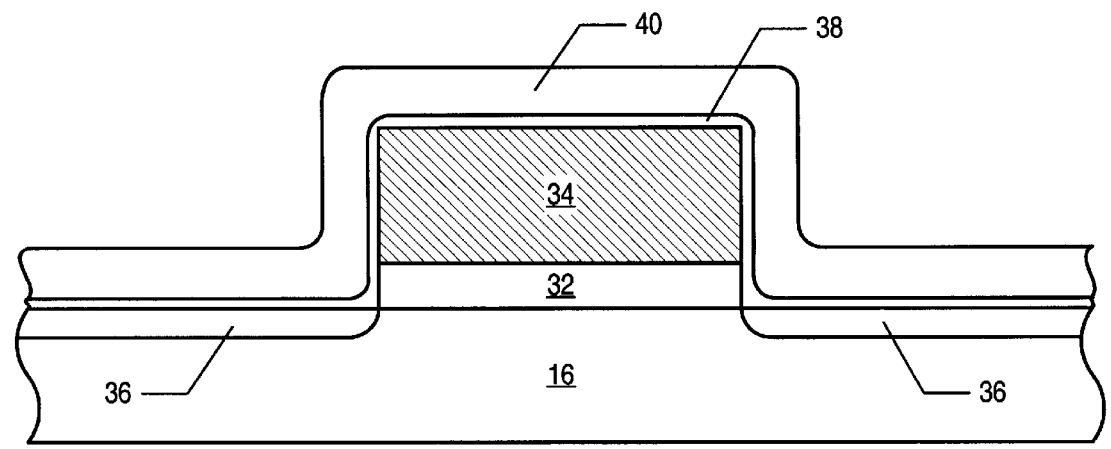
FIG. 4 is a partial cross-sectional view of the semiconductor topography, wherein a conformal nitride layer is deposited according to a processing step subsequent to FIG. 3.

FIG. 3 shows the conformal deposition of oxide layer 38 from, for example, a TEOS or silane source over gate conductor 34. Oxide layer 38 may be about 100 angstroms thick. As shown in FIG. 4, nitride layer 40 may then be deposited upon oxide layer 38. Nitride layer 40 may be deposited by LPCVD or PEVCD techniques. If gate conductor 34 is composed of polysilicon, electron traps can form at the interface between gate conductor 34 and nitride layer 40 if the two are in direct contact. Using oxide layer 38 as a buffer between gate conductor 34 and nitride layer 40 may prevent the formation of such traps.

Referring back to FIG. 1, semiconductor substrate 16 may then be positioned adjacent to (preferably directly onto) first electrode 12. The gap between the electrodes may be fixed at about 0.9–1.1 cm, and is optimally fixed at about 1.00 cm. A pump may be attached to port 20 to control the pressure within and remove gases from reaction chamber 11. A first gas flow is circulated through reaction chamber 11. The first gas flow may include a first argon flow, a first oxygen flow, and a first fluorocarbon flow. The flow rate of the first argon flow may be about 300–400 sccm, and is optimally about 350 sccm. The first oxygen flow rate may be about 14.4–17.6 sccm, and is optimally about 16 sccm. The first fluorocarbon flow preferably includes a first $CHF_3$ flow and a first $CF_4$ flow. The flow rate of the first $CHF_3$ flow may be about 22.5–27.5 sccm, and is optimally about 25 sccm. The flow rate of the first $CF_4$ flow may be about 45–55 sccm, and is optimally about 50 sccm. The pressure within reaction chamber 11 may be set at about 720–880 mT, and is optimally set about 800 mT. The pressure and gas flow into reaction chamber 11 are maintained at the selected levels for a time sufficient to allow stabilization of the gas flow rates and reaction chamber pressure before formation of a plasma within reaction chamber 11. An additional stabilization step may be undertaken in which semiconductor substrate 16 is secured to first electrode 12 to ensure electrical connectivity therebetween.

Figure 5:
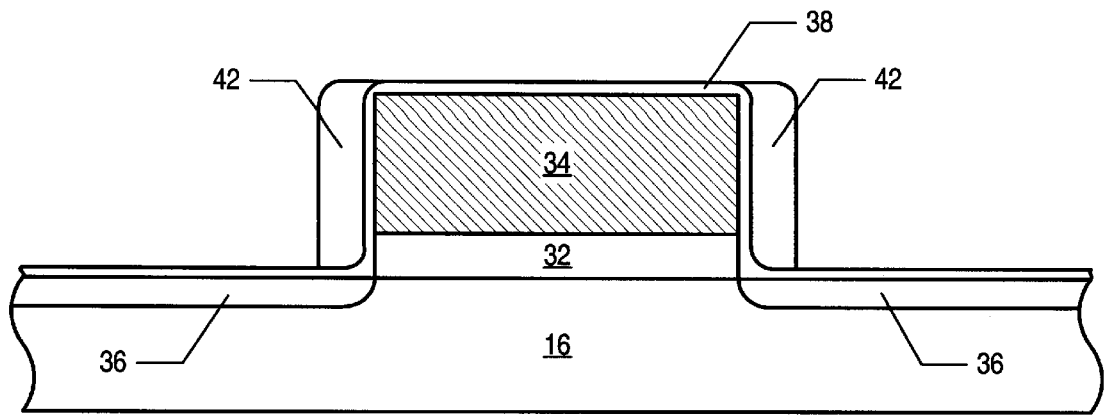
FIG. 5 is a partial cross-sectional view of the semiconductor topography, wherein nitride spacers are formed on the sidewalls of the gate conductor according to a processing step subsequent to FIG. 4.
Figure 6:
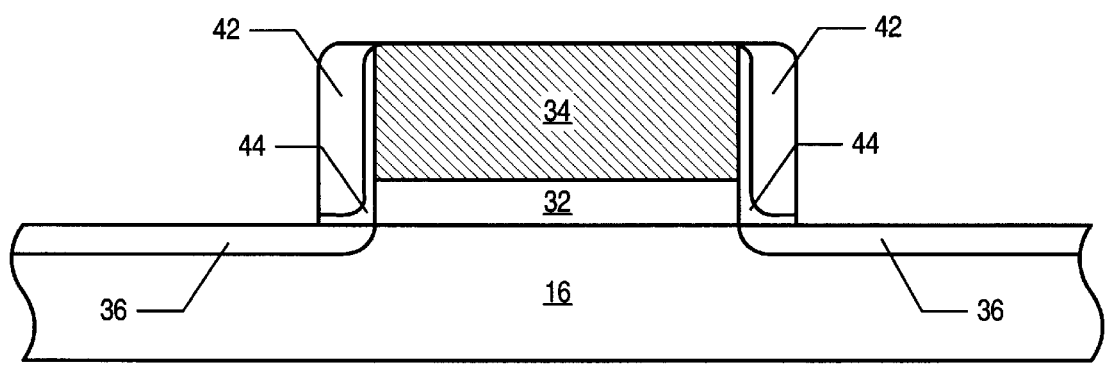
FIG. 6 is a partial cross-sectional view of the semiconductor topography, wherein portions of the oxide layer are removed according to a processing step subsequent to FIG. 5.

Once the environment within reaction chamber 11 is sufficiently stabilized, a main etch step is performed to form nitride spacers 42 as shown in FIG. 5. In this step, power source 22 supplies about 270–330 watts, and optimally about 300 watts, of power to first electrode 12 and second electrode 14. The power supplied by power source 22 is preferably split between first electrode 12 and second electrode 14 such that the power supplied to one electrode is 180 degrees out of phase with the power applied to the other electrode. Consequently, first electrode 12 is positive when second electrode 14 is negative, and vice versa. The potential difference between the first electrode and the second electrode serves to create a first plasma within reaction chamber 11. The bombardment of ions within the first plasma, in conjunction with the diffusion of reactive species from the plasma to the topography of semiconductor substrate 16, allows nitride layer 40 to be etched in a highly directional manner but with good selectivity to nitride over oxide. Furthermore, splitting power from power source 22 in such a manner may yield a higher degree of anisotropy than is achievable in systems where one electrode is powered and the other is grounded. Etching of nitride layer 40 may occur at a relatively high rate (e.g., about 25 angstroms per second). The total time needed to etch nitride layer 40 is dependent on the thickness of nitride layer 40.

The main etch step is preferably continued until nitride spacers 42 are formed adjacent to the sidewalls of gate conductor 34. The main etch step may be discontinued upon detection of etching of oxide layer 38 such that oxide layer 38 remains between nitride spacers 42 and gate conductor 34 and above LDD regions 36. Endpoint detection mechanisms such as optical emission spectroscopy and mass spectroscopy may be used to determine when oxide layer 38 is being removed. All portions of nitride layer 40 that do not form nitride spacers 42 are preferably removed in the main etch step.

Upon completion of the main etch step, the supply of power to first electrode 12 and second electrode 14 is discontinued. The gap between the electrodes may be increased to about 1.0–1.2 cm, and is optimally fixed at about 1.1 cm. A second gas flow may then be circulated through reaction chamber 14. The second gas flow may include a first argon flow and a first fluorocarbon flow. The flow rate of the second argon flow may be about 350–450 sccm, and is optimally about 400 sccm. The second fluorocarbon flow may include a second $CHF_3$ flow and a second $CF_4$ flow. The flow rate of the second $CHF_3$ flow may be about 31.5–38.5 sccm, and is optimally about 35 sccm. The flow rate of the second $CF_4$ flow may be about 13.5–16.5 sccm, and is optimally about 15 sccm. The pressure within reaction chamber 11 may be set at about 180–220 mT, and is optimally set at about 200 mT. The pressure and gas flow into reaction chamber 11 are maintained at the selected levels for a time sufficient to allow stabilization of the gas flow rates and reaction chamber pressure before formation of a second plasma within reaction chamber 11.

After the environment within reaction chamber 11 has stabilized sufficiently, an overetch step may be performed. The overetch step may constitute about 5% of the total etch time. The primary goal of this step is to clear out all of the deposited material overlying LDD regions 36 and adjacent to the exposed lateral surfaces of nitride spacers 42 (see FIG. 6). This deposited material ideally consists only of oxide layer 38, but any portions of nitride layer 40 still remaining from the main etch step may be removed during the overetch step. The portions of oxide layer 38 not removed during the overetch step may form oxide buffers 44 between nitride spacers 42 and the gate structure consisting of gate oxide 32 and gate conductor 34. In this step, power source 22 supplies about 180–220 watts, and optimally about 200 watts, of power to first electrode 12 and second electrode 14. The power supplied by power source 22 is split as described above in the main etch step. Etching of oxide layer 38 may occur at a relatively slow rate (e.g., about 10–15 angstroms per second). Various endpoint detection mechanisms (e.g., optical emission spectroscopy and mass spectroscopy) may be used to determine when portions of the substrate are being etched by the plasma and etching should be discontinued. Depending upon the nature of byproducts and particulate matter arising from the etching process, multiple stabilization and flush steps may be necessary after the overetch step is completed.

Figure 7:
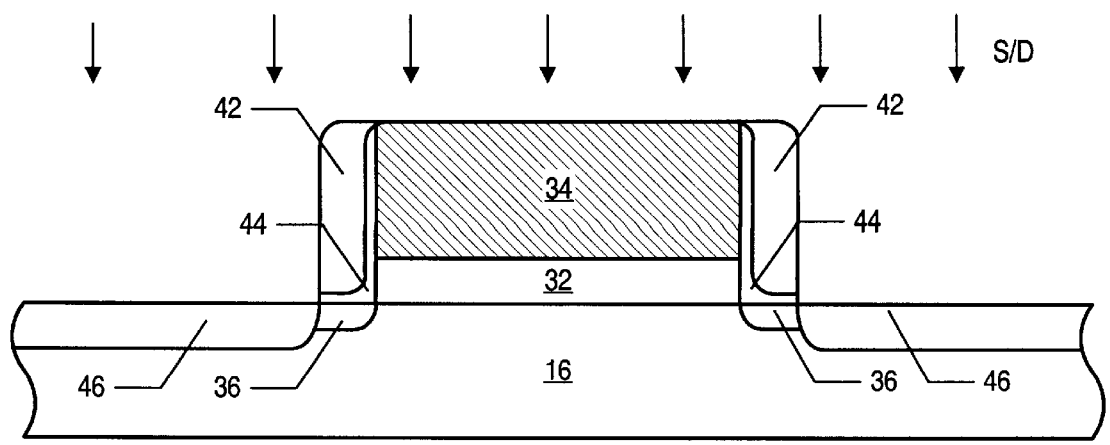
FIG. 7 is a partial cross-sectional view of the semiconductor topography, wherein a source/drain implant that is self-aligned to the exposed lateral surfaces of the nitride spacers is forwarded to the semiconductor topography according to a processing step subsequent to FIG. 6.

FIG. 7 shows a subsequent source/drain implant that may be used to form source/drain regions 46. Since nitride spacers 42 prevent implantation of the portions of semiconductor substrate 16 directly beneath them, the lengths of LDD regions 36 and source/drain regions 46 are thus defined by the thicknesses of nitride spacers 42 (with some allowance for diffusion of dopants from source/drain regions 46 under spacers 42).

It will be appreciated to those skilled in the art having the benefit of this disclosure that this invention is believed to provide a dry etch method capable of etching nitride and oxide layers. It is understood that while this process is of particular benefit in the fabrication of ultra thin nitride spacers, the process may be used to form spacers of a variety of thicknesses with a high degree of uniformity. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A dry etch method, comprising:
   introducing a semiconductor substrate between a pair of electrodes maintained within a reaction chamber;
   applying a first quantity of low frequency power to the pair of electrodes from an RF power source while a first gas flow is circulated through the reaction chamber, the first gas flow comprising a first inert gas flow, a first oxygen flow, and a first fluorocarbon flow, wherein the ratio of fluorine atoms to carbon atoms within the first fluorocarbon flow is less than 4:1, and wherein said applying a first quantity of low frequency power creates a first plasma;
   etching a portion of a nitride layer arranged above the semiconductor substrate with the first plasma;
   terminating applying a first quantity of low frequency power subsequent to etching a portion of a nitride layer;
   applying a second quantity of low frequency power from the RF power source to the pair of electrodes while a second gas flow is circulated through the reaction chamber, the second gas flow comprising a second inert gas flow and a second fluorocarbon flow, and wherein the ratio of fluorine atoms to carbon atoms within the second fluorocarbon flow is less than the ratio of fluorine atoms to carbon atoms within the first fluorocarbon flow, and wherein said applying a second quantity of low frequency power creates a second plasma; and
   etching a portion of an oxide layer disposed beneath the nitride layer and above the semiconductor substrate with the second plasma.

2. The method of claim 1, wherein the nitride layer is arranged above a gate conductor, the gate conductor being arranged above the semiconductor substrate, and wherein said etching a portion of a nitride layer forms nitride spacers adjacent to the sidewalls of the gate conductor.

3. The method of claim 1, wherein the first inert gas flow comprises a first argon flow, and wherein the flow rate of the first argon flow is about 75–83 percent of the total flow rate of the first gas flow.

4. The method of claim 1, wherein the oxide layer is arranged upon a gate conductor, the gate conductor being arranged upon the semiconductor substrate, and wherein junctions are formed within the semiconductor substrate adjacent to and on opposite sides of the gate conductor, and wherein said etching a portion of a nitride layer forms spacers from the nitride layer, and wherein said etching a portion of an oxide layer substantially removes the portions of the oxide layer adjacent to the exposed lateral surfaces of the spacers and overlying the junctions.

5. The method of claim 1, wherein the second inert gas flow comprises a second argon flow, and wherein the flow rate of the second argon flow is about 85–86 percent of the total flow rate of the second gas flow.

6. The method of claim 1, further comprising, between said applying a first quantity of low frequency power and said applying a second quantity of low frequency power, adjusting the pressure within the reaction chamber from about 720–880 mT to about 180–220 mT.

7. The method of claim 1, wherein said applying a first quantity of low frequency power comprises applying about 270–330 watts of power to the pair of electrodes, and wherein said applying a second quantity of low frequency power comprises applying about 180–220 watts of power to the pair of electrodes, and wherein the power applied to the electrodes is split such that the power applied to one electrode is 180 degrees out of phase with the power applied to the other electrode.

8. The method of claim 1, wherein said applying a first quantity of low frequency power and said applying a second quantity of low frequency power both comprise applying power at a frequency of about 360–440 kHz.

9. The method of claim 1, further comprising, between said applying a first quantity of low frequency power and said applying a second quantity of low frequency power, adjusting the gap between the pair of electrodes from about 0.9–1.1 cm to about 1.0–1.2 cm.

10. The method of claim 1, wherein said etching a portion of a nitride layer removes nitride at a rate of about 25 angstroms/second, and wherein said etching a portion of an oxide layer removes oxide at a rate of about 10–15 angstroms per second and at a oxide:silicon selectivity of about 15:1.

11. The method of claim 1, further comprising, a gap between the pair of electrodes for the application of said first low frequency power is less than a gap between the pair of electrodes for the application of said second quantity of low frequency power.

12. A dry etch method, comprising:
   positioning a semiconductor substrate on the first electrode of a pair of electrodes maintained within a reaction chamber, wherein the electrodes are parallel and spaced from each other by a gap;
   first fixing the gap between the electrodes at about 0.9–1.1 cm;
   first circulating a first gas flow through the reaction chamber, wherein the first gas flow comprises a first Ar flow at a first Ar flow rate of about 300–400 sccm, a first $O_2$ flow at a first $O_2$ flow rate of about 14.4–17.6 sccm, a first $CHF_3$ flow at a first $CHF_3$ flow rate of about 22.5–27.5 sccm, and a first $CF_4$ flow at a first $CF_4$ flow rate of about 45–55 sccm;

first setting the pressure within the reaction chamber at about 720–880 mT;

first applying about 270–330 watts of power at a frequency of about 360–440 kHz to create a first plasma; and etching a portion of a nitride layer arranged above the semiconductor substrate with the first plasma;

terminating said applying about 270–330 watts of power;

second fixing the gap between the electrodes at about 1.0–1.2 cm;

second circulating a second gas flow through the reaction chamber, wherein the second gas flow comprises a second Ar flow at a second Ar flow rate of about 350–450 sccm, a second $CHF_3$ flow at a second $CHF_3$ flow rate of about 31.5–38.5 sccm, and a second $CF_4$ flow at a second $CF_4$ flow rate of about 13.5–16.5 sccm;

second setting the pressure within the chamber to about 180–220 mT; and second applying about 180–220 watts of power at a frequency of about 360–440 kHz to create a second plasma; and etching a portion of an oxide layer disposed beneath the nitride layer and above the semiconductor substrate with the second plasma.

13. The method of claim 12, wherein the oxide layer is disposed upon a gate conductor arranged upon the semiconductor substrate, and wherein junctions are formed within the semiconductor substrate adjacent to and on opposite sides of the gate conductor, and wherein said etching a portion of a nitride layer forms spacers from the nitride layer, and wherein said etching a portion of an oxide layer substantially removes the portions of the oxide layer adjacent to the exposed lateral surfaces of the spacers and overlying the junctions.

14. The method of claim 12, wherein the first Ar flow rate is about 350 sccm, the first $O_2$ flow rate is about 16 sccm, the first $CHF_3$ flow rate is about 25 sccm, the first $CF_4$ flow is about 50 sccm, and wherein the pressure in said first setting the pressure is about 800 mT, and wherein the gap in said first fixing the gap is about 1.00 cm, and wherein the quantity of power in said first applying is about 300 W, and wherein the frequency of the power supplied is about 400 kHz.

15. The method of claim 12, wherein the second Ar flow rate is about 400 sccm, the second $CHF_3$ flow rate is about 35 sccm, the second $CF_4$ flow is about 15 sccm, and wherein the pressure in said second setting the pressure is about 200 mT, and wherein the gap in said second fixing is about 1.10 cm, and wherein the quantity of power in said second applying is about 200 W, and wherein the frequency of the power supplied is about 400 kHz.

16. A semiconductor fabrication process, comprising:

performing a first dry etch process on a semiconductor topography, wherein the first dry etch process is selective to nitride over oxide;

terminating the first dry etch process; and performing a second dry etch process on the semiconductor topography, wherein the second etch process is selective to oxide over silicon.

17. The process of claim 16, wherein said first dry etch process removes nitride at a rate of approximately 25 angstroms per second.

18. The process of claim 16, wherein said second dry etch process removes oxide at a rate between approximately 10 angstroms per second and 15 angstroms per second and has an oxide:silicon selectivity of approximately 15:1.

19. The process of claim 16, wherein the second dry etch process constitutes approximately 5% of a total etch time for the first and second etch processes.

20. The process of claim 16, further comprising:

forming an oxide layer above a silicon substrate; and forming a nitride layer over the oxide layer to form the semiconductor topography.

21. The method of claim 20, wherein the oxide layer is arranged upon a gate conductor, the gate conductor being arranged upon the semiconductor substrate, and wherein junctions are formed within the semiconductor substrate adjacent to and on opposite sides of the gate conductor, and wherein said etching a portion of a nitride layer forms spacers from the nitride layer, and wherein said etching a portion of an oxide layer substantially removes the portions of the oxide layer adjacent to the exposed lateral surfaces of the spacers and overlying the junctions.

22. The process of claim 16, wherein the first dry etch process comprises applying a first quantity of low frequency power and wherein the second dry etch process comprises applying a second quantity of low frequency power.

23. The process of claim 22, wherein the first quantity of low frequency power comprises between approximately 270 watts and approximately 330 watts of power.

24. The process of claim 22, wherein the second quantity of low frequency power comprises between approximately 180 watts and approximately 220 watts of power.

25. The method of claim 22, wherein said applying a first quantity of low frequency power and said applying a second quantity of low frequency power both comprise applying power at a frequency between approximately 360 kHz and approximately 440 kHz.

* * * * *